United States Patent [19]

Kroger et al.

[11] 3,925,078

[45] Dec. 9, 1975

[54] HIGH FREQUENCY DIODE AND METHOD OF MANUFACTURE

[75] Inventors: Harry Kroger, Sudbury; Curtis N. Potier, Holliston, both of Mass.

[73] Assignee: Sperry Rand Corporation, New York, N.Y.

[22] Filed: Nov. 26, 1973

[21] Appl. No.: 419,185

Related U.S. Application Data

[62] Division of Ser. No. 223,616, Feb. 4, 1972, Pat. No. 3,816,194.

[52] U.S. Cl. .......................... 96/36.2; 96/36; 156/3; 156/17; 156/8; 427/82; 427/89; 427/91

[51] Int. Cl.$^2$ ...................... G03C 5/00; B29C 17/08

[58] Field of Search ........ 156/17, 13, 3, 8; 117/212, 117/217; 96/36.2, 36; 427/82, 89, 91

[56] References Cited

UNITED STATES PATENTS

| | | | |
|---|---|---|---|
| 3,307,239 | 3/1967 | Ledselter et al. | 156/17 |
| 3,423,205 | 1/1969 | Skaggs et al. | 96/36.2 |
| 3,423,260 | 1/1969 | Heath et al. | 156/3 |
| 3,554,821 | 1/1971 | Caulton et al. | 156/3 |
| 3,607,379 | 1/1968 | Leinkram et al. | 117/212 |
| 3,634,159 | 1/1972 | Croskery | 96/36.2 |
| 3,689,392 | 9/1972 | Sandera | 156/17 UX |
| 3,775,200 | 11/1973 | De Nobel et al. | 156/17 |
| 3,849,217 | 11/1974 | Kroger | 156/17 |

*Primary Examiner*—Charles L. Bowers, Jr.
*Assistant Examiner*—Edward C. Kimlin
*Attorney, Agent, or Firm*—Howard P. Terry

[57] ABSTRACT

High frequency diodes are manufactured by methods in which extended dual mesas are formed upon a conductive substrate, one mesa incorporating the active junction and the other supporting the active mesa in reduced parasitic capacitive relation, with the substrate supporting the combination of mesas and with an efficient heat sink cooperating with the active mesa. Novel ring-shaped diodes made according to the method feature a high degree of circular symmetry and therefore freedom from burn out, thermal compression bonding being used to perfect the bond between the active mesa and a diamond heat sink. Symmetry of the diode is assured by use of a novel photoresist mask generation technique.

2 Claims, 11 Drawing Figures

HIGH FREQUENCY DIODE AND METHOD OF MANUFACTURE

CROSS-REFERENCE TO RELATED APPLICATION

This is a division of patent application Ser. No. 223,616 filed Feb. 4, 1972, now U.S. Pat. No. 3,816,194, and entitled 'High Frequency Diode and Method of Manufacture' in the names of Harry Kroger and Curtis N. Potter.

BACKGROUND OF THE INVENTION

1. Field of the Invention

The invention pertains to lineal and ring-shaped high frequency or microwave semiconductor diode devices of the type suitable for use as active elements at elevated power levels in microwave amplifiers and oscillators and to methods of manufacture of such diodes. The invention more particularly relates to microwave diodes having ring-shaped active junctions supported upon concentrically disposed mesas that are supported, in turn, on a substrate. There is supported from the active junction mesa an efficient heat sink.

2. Description of the Prior Art

Generally, prior art high frequency diodes with extended active junctions expected to permit relatively high power operation in microwave amplifiers or oscillators, such as high efficiency mode oscillators, have suffered from various deficiencies. The nature of such high efficiency mode circuit devices imposes serious demands upon the diode devices used in them. The operating requirements thus imposed have been discussed in the generally available literature and in the M. I. Grace U.S. patent application Ser. No. 17,673 for a "Semiconductor Diode High Frequency Signal Generator," filed Mar. 9, 1970 now U.S. Pat. No. 3,646,581, in the M. I. Grace U.S. patent application Ser. No. 23,130 for a "Semiconductor Diode High Frequency Signal Generator," filed Mar. 27, 1970 now U.S. Pat. No. 3,646,357, in the M. I. Grace, H. Kroger, and H. J. Pratt U.S. patent application Ser. No. 102,738 for a "Broad Band High Efficiency Mode Energy Converter," filed Dec. 30, 1970 now U.S. Pat No. 3,714,605, and in other pending Sperry Rand patent applications.

A further and primary limitation has been connected in the prior art with the need greatly to improve heat dissipation from the active junctions of high frequency diodes. While attempts have been made in the past to fabricate long, thin lineal diodes and circular or ring-shaped microwave diodes, lack of perfect forming and bonding of the junctions has hindered efficient heat removal from the diode and has not permitted reliably efficient circuit operation. Attempts to reduce undesired parasitic capacitive effects by deeply etching the devices have yielded fragile and unsymmetric devices, the lack of symmetry promoting burn out at lower than desired operating power levels and making perfect thermal compression bonding of the active junction to a heat sink difficult to attain.

SUMMARY OF THE INVENTION

The present invention relates to high frequency diodes especially of the type for efficient operation in high efficiency mode diode circuits, including extended or ring-shaped junction devices for operation at increased microwave power levels, and to methods of manufacture of such diode devices. In the circularly symmetric form of the novel diode, a ring-shaped active junction is supported by an active mesa formed upon a second or larger mesa having a configuration for reducing parasitic capacity effects, the concentrically disposed mesas being supported on a substrate formed integrally with the second mesa of an electrically conducting material such as gold. A diamond heat sink is bonded by thermal compression bonding to the junction formed on the active mesa. The inventive diode is made by a novel succession of dopant diffusion, metal plating, masking, etching, and thermal compression bonding steps, as will be further described.

DESCRIPTION OF THE PREFERRED EMBODIMENTS

Figure 1:
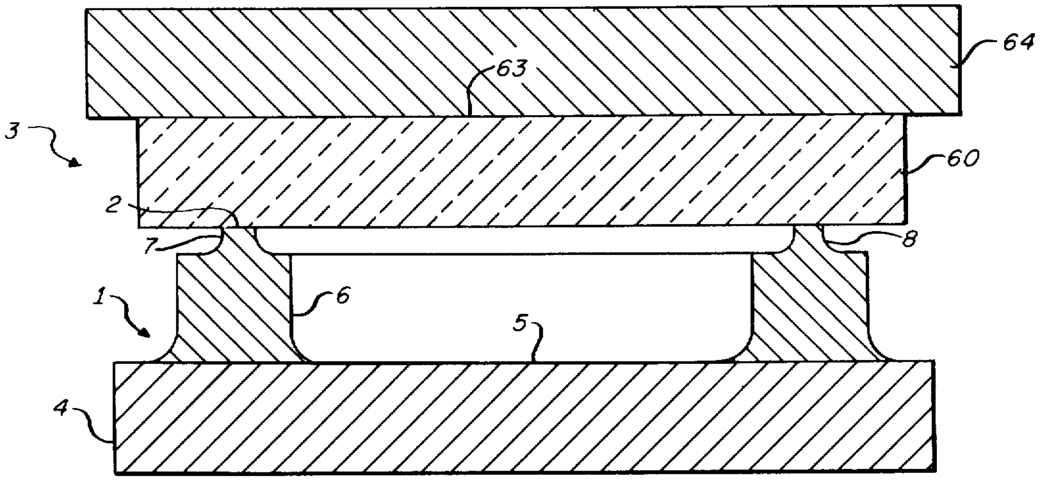
FIG. 1 is an elevation view in a cross-section of a preferred form of the invention.

The invention is a high frequency semiconductor trapped plasma avalanche triggered transit diode or TRAPPAT device of the novel double mesa kind shown generally in FIG. 1, which cross-section view of the diode does not show certain details yet to be discussed that are small in scale and not capable of easy representation in the figure. In FIG. 1, it is seen that the novel diode includes a main body 1 of silicon or other semiconductor material and a substrate 4 which may consist of gold. As illustrated, the diode device has generally circular symmetry, so that the current-conducting junction 2 between body 1 and heat sink 3 is circular or ring-shaped. Projecting toward heat sink 3 from the surface 5 of substrate 4 is a first annular mesa 6 which desirably provides reduced capacitance between body 1 and heat sink 3, which heat sink may be made of copper, gold, or diamond. Projecting in turn from the ring-shaped face 7 of mesa 6 is a second annular mesa 8 that carries the active circular or ring-shaped junction 2 of the diode. The configuration shown in FIG. 1 permits both convenient and reliable thermal compression bonding at junction 2 of mesa 8 to the heat sink 3, as will be seen, and high efficiency device operation.

Base plate 4 is made of a highly conducting material such as gold. The fact that base plate 4 has an integral central metal region closing the interior of the annular mesa ring structure 6, 8, makes subsequent thermal compression bonding easy to accomplish, as will be seen. Furthermore, in fabricating the device incorporating metal plate 4, the degree of extension of the plate 4 past the periphery of mesa 6 is readily controlled. Relatively large extensions, even if a low resistivity semiconductor material is used as in the past for substrate 4, may seriously reduce the efficiency of the operating diode. For example, an extension of semiconductor material as great as 15 mils has been demonstrated to reduce the efficiency of typical TRAPPAT diode oscillators from 25 to 4 percent. It is believed that such reductions in efficiency arise because of high frequency current losses associated with the resistance of the semiconductor material and because high frequency currents must flow mainly on the surfaces of the materials of the diode. In a representative example, the active mesa 8 is about 8 microns in height and the second mesa 6 is 2 mils high. The gold base plate 4 may be about 3.5 to 4 mils thick. In a representative circular form of the device, the mean diameter of the annular or ring-shaped active bonding surface 2 is about 0.04 centimeters, while the separation between surface 5 and heat sink 3 is about 50 microns and the width of surface 2 is about 8 microns. Thus, it will be seen that these and other parts of the novel high frequency diode are of correspondingly very small size. Long, thin, or lineal, diodes may be made according to the invention as would be represented by generation of a figure of translation from the cross-section shown in FIG. 1, and as will be further indicated in the discussion to follow which applies generally to novel diodes of either type.

According to the invention, ring-shaped or long, thin active diode elements are generated, since they possess superior thermal dissipation properties because of their small thermal spreading resistance and more uniform temperature of operation. It is preferred in the present invention in the instance of ring-shaped diodes for microwave applications demanding wide band amplifier performance to use very large values of the ratio of circumference to ring width. Such ring-shaped or long and thin diodes have the virtues of maintaining uniform current density and of demonstrating low thermal impedance.

The design for such novel ring diodes for performing efficiently in a high frequency or microwave oscillator requires that additional physical principles be considered. The total area $A$ of the ring-shaped junction 2 must not be great. The capacitive reactance $X_c$ of the device must be greater than about 10 ohms at the operating frequency:

$$X_c = W/\omega\epsilon A$$

where:

W = width of the depletion layer of the diode, $\omega$ = frequency of operation in radians per second, and $\epsilon$ = dielectric constant of the semiconductor material.

Furthermore, there is for a given operating frequency, a maximum value of the circumference C of the ring. If the ring is large enough, standing waves of a frequency equal to the fundamental oscillation frequency or to a harmonic thereof can be set up around the ring. Such oscillations will generally not couple properly to the oscillator circuit and the device may not readily deliver useful power to a load. Such spurious signals are undesired, since the diode must support within its associated circuit in a predetermined manner several harmonics of the fundamental oscillation frequency in a manner discussed in the above mentioned M. I. Grace patent applications and elsewhere.

Figure 2:
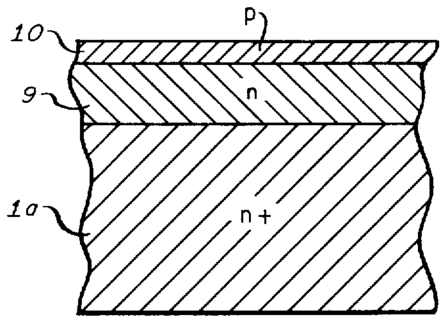
FIGS. 2 to 8 are fragmentary enlarged scale cross-section views similar to FIG. 1 for use in explaining the method of making the annular mesas of FIG. 1.

The manufacture of the novel diode of FIG. 1 is begun as in FIG. 2, for instance, by operating upon a silicon body 1*a* of the *n*+ type having a type *n* epitaxial layer 9 for forming a diffused layer 10, the process beginning by the use of a conventional method of diffusing a dopant such as boron into the epitaxial layer 9 to form the type *p* surface layer 10. As in FIG. 3, the *n*+ silicon body 1*a* is then thinned to a uniform thickness of about 2 mils to form body 1*b* by using any one of the several conventional processes known in the art for the purpose, such as by etching or mechanical grinding and polishing or a combination of such methods. In practice, the thickness of the *n*+ *silicon body 1b* in FIG. 3 may be substantially equal to the desired height of the final active mesa 8 plus the capacitance reducing mesa 6.

Immediately after the thinning of silicon layer 1*b*, the layer 4 of gold or the like is formed on silicon layer 1*b* by electroplating or by other convenient plating methods. The gold layer 4 is allowed to grow as in FIG. 3 to between 3 and 4 mils in thickness. The gold layer 4 serves to overcome the prior art difficulties mentioned above, and also serves as an excellent mechanical support for the thin and relatively fragile semiconductor body during subsequent manufacturing steps, such as photoresist masking, etching, and thermal compression bonding steps. The fabrication of the gold layer 4 may precede or follow the laying down of chromium layer 11 and gold layer 12, as desired. To aid in forming gold layer 4, a first layer of chromium and a second layer of gold, each about 1000 Angstroms thick, may be formed on layer 1*b* by evaporation or sputtering. The thin chromium and gold layers are not shown in the figure.

Figure 4:
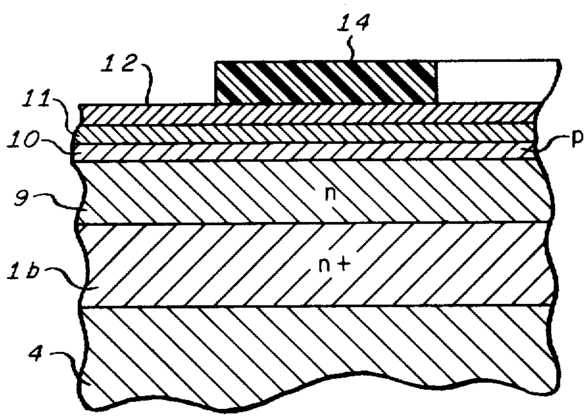
Figure 3:
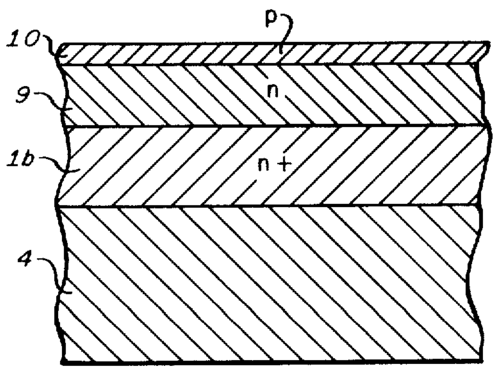

In the invention, the active mesa 8 and junction 2 are formed first, mesa 6 then being generated. For this purpose, the structure of FIG. 3 is subjected to several modifications in succession, as is seen in FIG. 4. To form the active mesa 8, two thin metal layers 11 and 12 are added to the surface of type *p* layer 10. A thin layer 11, preferably of chromium, is first formed by a conventional vacuum evaporation or sputtering process on type *p* layer 10. Layer 11 may be on the order of 50 to 100 Angstroms thick and acts to form a firm bond to the semiconductor material of layer 10. A gold layer 12 is next formed, again by evaporation or sputtering, of a thickness of the order of 3000 Angstroms, being very firmly bonded to chromium layer 11.

To form the active mesa 8 of FIG. 1, a masking ring of photoresist 14 is applied in a conventional manner to the surface of gold layer 12, as in FIG. 4. Where layer 12 consists of gold, a conventional gold etchant is used to remove the gold layer except for a uniform ring of layer 12 (FIG. 5) underlying photo-resist ring 14. Next, the chromium layer 11 is removed in a similar manner with a suitable chromium etchant, leaving the structure in the general form shown in FIG. 5. The ring-shaped metal layers 11 and 12 are now of substantially the same annular shape, the photoresist layer 14 having been removed after use in the usual manner as a mask for the several metal etching processes.

Figure 5:
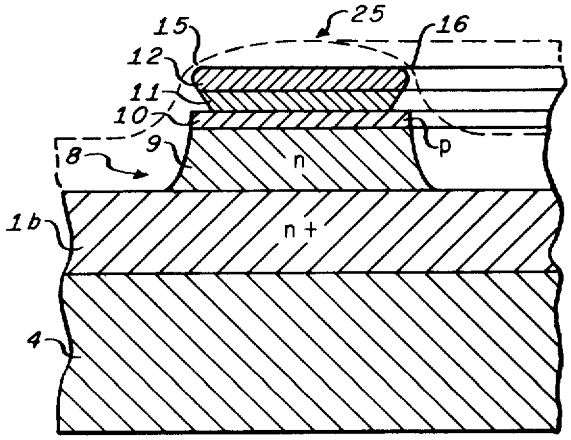

In a succeeding step after layers 11 and 12 are formed into rings, the type *n* silicon layer 9 is deeply etched as in FIG. 5 by a conventional etching process to form the mesa 8 of FIG. 1 by undercutting type *p* and type *n* silicon except from directly beneath the ring layers 11 and 12. Having thus formed the active mesa 8, it is desired to generate the capacitance reducing means 6 of FIG. 1. For this purpose, a novel process is employed which preserves the consistency of the active mesa 8 and its shape, a process which protects the annular edges 15, 16 (FIG. 5) of the active mesa portion 8 during formation of mesa portion 6 of FIG. 1. Such protection would not reliably be afforded by a conventionally applied photoresist mask as indicated at 25 (FIG. 5) which, because of adverse surface tension and other effects, would permit only poor coverage of edges 15, 16.

Figure 6:
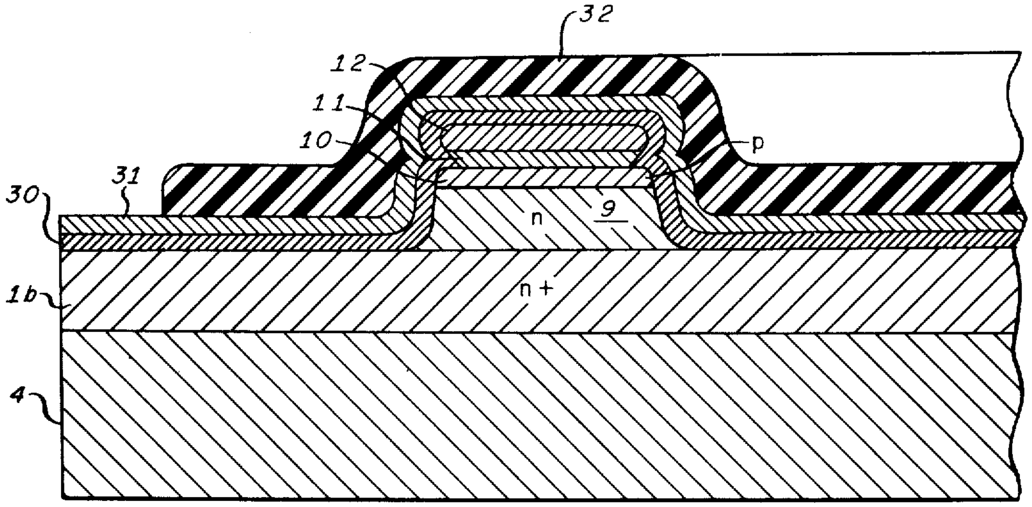

For providing reliable manufacture of mesa 6 in the presence of the tapered edges 15, 16 of mesa 8, the several steps illustrated in FIG. 6 are taken. First, it is observed that conventional photoresist materials adhere insufficiently well to silicon to permit successful application of prolonged etches. Such photoresist materials are found to adhere well to certain metals, however, and a thin layer or layers of such metals is therefore employed according to the present invention over the several surfaces of mesa portion 8 as a base for forming a particularly etchant-resistant photoresist mask.

In FIG. 6, a very thin temporary chromium layer 30 is first applied over the exposed surface of $n+$ layer 1*b* and both sides of type *n* layers 9 and of type *p* layer 10. The temporary chromium layer 30 is also carefully arranged fully to cover both of the undercut or concave edges of chromium layer 11 and of gold layer 12 as well as the top surface of gold layer 12.

Either a single temporary chromium layer 30 may be used, or the chromium layer 30 may be followed by a temporary gold layer 31. Chromium is found to be an acceptable metal for the purpose, since it adheres strongly both to silicon and to conventional photoresist materials. An additional thin covering layer 31 of gold is preferred, however, because chromium alone is slightly attacked by silicon etches; flaking off of thin chromium layers is often observed rather than mere dissolving in an etchant. Gold is completely inert in a silicon etchant and is more likely than chromium, even in thin layers, to be free of pin holes or other flaws. The gold over-layer 31 can therefore act as an excellent mask against the silicon etch, being more resistant than the photoresist itself. The photoresist material is more susceptible of damage in prolonged silicon etches, especially at sharp edges such as annular edges 15 and 16 of FIG. 5, where the photoresist material applied by conventional application methods would inherently be very thin.

Accordingly, the temporary chromium layer 30 and the gold layer 31 are laid down on the structure as illustrated in FIG. 6 by evaporation or sputtering, for example. Immediately thereafter, the annular photoresist layer 32 is formed in the usual manner over the active mesa portion 8, covering major parts of the temporary gold layer 31. After photographic development of the photoresist, the type $n+$ layer 1*b* is deeply etched, forming mesa portion 6; in the process, the unprotected portions of the type $n+$ layer 1*b* are entirely removed to the surface 33 of gold layer 4, as in FIG. 7.

Figures 7, 8:
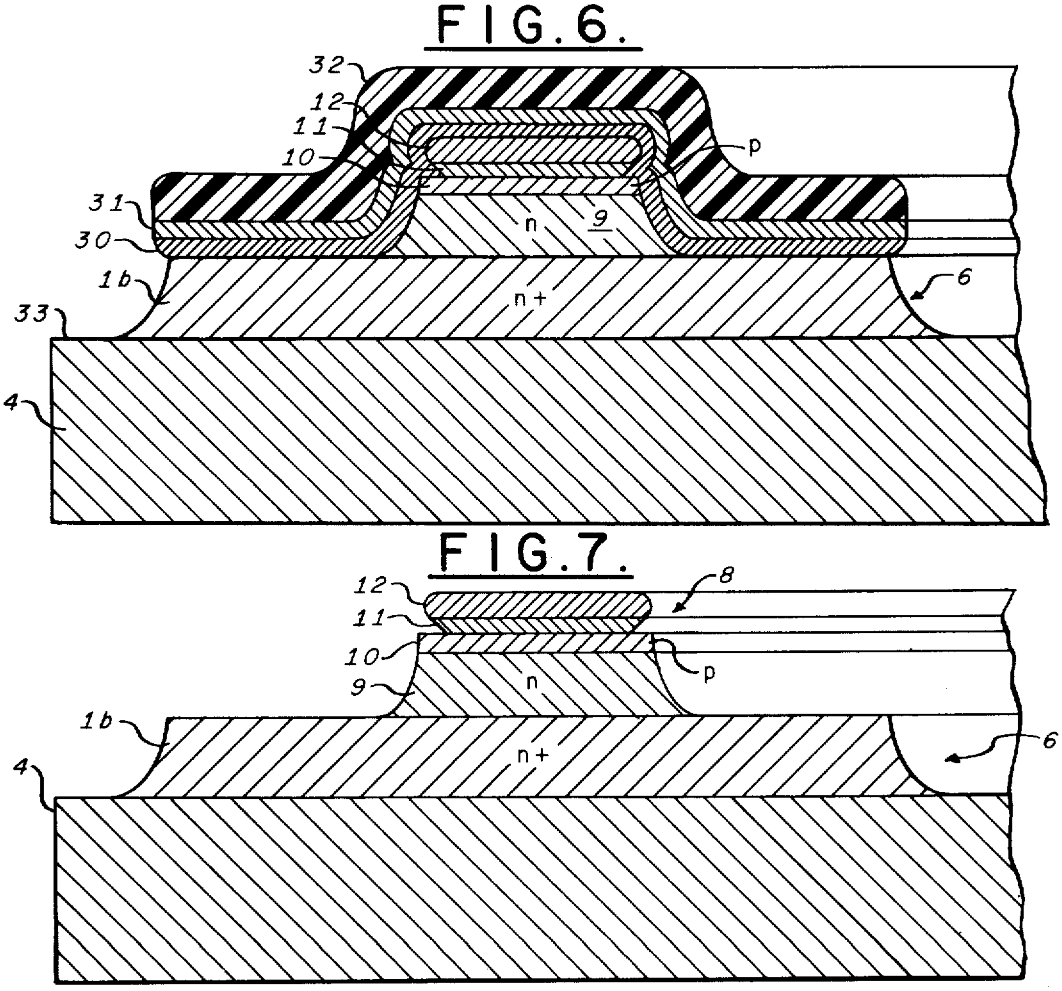

Subsequent to etch removal of the undesired parts of the type $n+$ layer 1*b*, the temporary photoresist mask material 32 of FIG. 7 is removed in the conventional manner, and the protective metal layers 31 and 32 are successively removed by sequential etching. First, the temporary over layer 31 is removed using etchants well known in the art which do not significantly attack the underlying chromium layer 30. Then, the temporary chromium layer 30 is removed, using an appropriate etchant which does not attack the annular gold active contact layer 12, the chromium layer 30 acting to protect the active contact layer 12. A gold layer 31 of thickness of the order of 100 to 200 Angstroms is found to be sufficient to protect the structure against silicon etchants. Since the gold contact layer 12 is about 2000 Angstroms thick, no significant etching of layer 12 will occur, even if pin holes are present in chromium layer 30 during the removal of the temporary outer gold layer 31. In the final structure of FIG. 6, the shape and width of the active mesa 6 and the gold contact 12 are preserved accurately and reliably.

The resultant ring diode structures of FIG. 8 have extremely uniform cross-sections over the many active mesas normally present over a silicon wafer surface before dicing, since the active mesas 8 are advantageously etched from a flat silicon wafer with no large amount of metal being exposed to etchant. While a consequence of the method is a somewhat greater non-uniformity of the major mesas 6, such is not of vital consequence, since mesas 6 do not have an active or junction surface requiring accurate area and width control, nor is the shape of each of mesas 6 critical. The method of fabrication permits the critical characteristics of the much smaller sensitive active mesas 8 and annular contacts 12 to be accurately controlled.

Figures 10, 11:
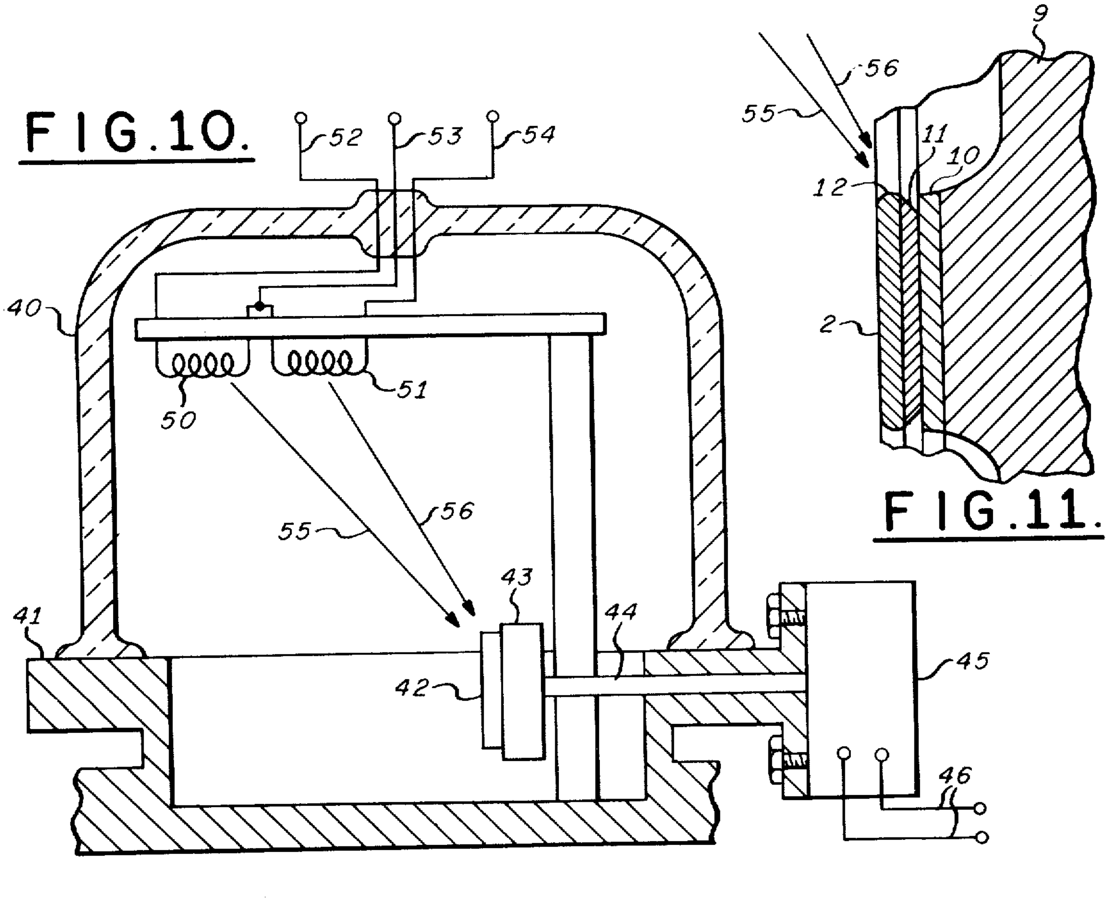
FIG. 10 is a cross-section elevation view of apparatus for practicing a method of the invention.
FIG. 11 is an enlarged view of a portion of FIG. 10 useful in explaining the operation of the apparatus of FIG. 10.

The preferred manner of deposition of chromium and gold layers 30 and 31 may be explained with respect to FIGS. 10 and 11. The metal layers 30 and 31 must with a good degree of uniformity continuously cover the annular undercut or concave regions in layers 11 and 12, such as below edges 15 and 16 of FIG. 5. It is apparent that the flow of metal toward the active mesa 8 should not be normal to the active surface 2 or gaps will result. Second, it is important that the wafer bearing one of the ring diodes (or a plurality of such diodes) be rotated, so that all parts of both sides of all active mesas will be covered completely with metal layers in preparation for putting down the photoresist mask 32 of FIG. 7. Ten to 30 rotations in a 3 to 5 minute interval may be employed.

The protective metal layers 30, 31 may be put down by sputtering or by metal evaporation processes in a substantial vacuum such as may be produced in a bell jar 40 (FIG. 10) mounted on a vacuum base 41 and provided with the usual evacuation pumping equipment (not shown). The wafer 42 bearing mesas 8 to be coated is affixed to a conventional chuck 43 adapted to be manually spun on a shaft 44 or driven by motor 45 when electrical power is supplied at terminals 46. Supported above and to one side of chuck 43 are electrically heatable metal vapor sources, such as the conventional chromium source 50 and the conventional gold source 51.

With bell jar 40 properly evacuated and the wafer 42 mounted on chuck 43, chuck 43 is operated. Heating power is supplied via terminals 52, 53 to chromium vapor source 50, so that chromium is distilled in the conventional manner along the direction of arrow 55 toward wafer 42. As seen in FIG. 11, the angular relation of arrow 55 to surface 2 is such that the concave or undercut surfaces of layers 11, 12 are coated with chromium layer 30. It will be understood that a portion of the undercut of the inner side of the active mesa 8 is instantaneously coated at the same time as the diametrically opposite portion of the undercut or reentrant concavity of the outer side of mesa 8. Both inner and outer sides of mesa 8 are thus regularly and cyclically exposed to chromium source 50.

When a sufficient layer of chromium has been grown, heat is removed from chromium vapor source 50 and electrical power is applied via terminals 53, 54 to heat the gold source 51. Thus, the gold layer 31 is formed by a flux of gold vapor in the sense of arrow 56, the wafer 42 is removed from bell jar 40 and the photoresist layer 32 is applied. In order to form as thick a layer as possible of photoresist mask over the edges 15, 16 and other parts of active mesa 8, it is desirable to apply as thick a layer of fluid photoresist material as possible. This is very simply accomplished by dipping the face of wafer 42 into a surface of unthinned fluid photoresist material. As previously noted, the photoresist material is used to produce mask 32 of FIG. 7 and the previously described process for completing the structure of FIG. 8 is then undertaken.

Figure 9:
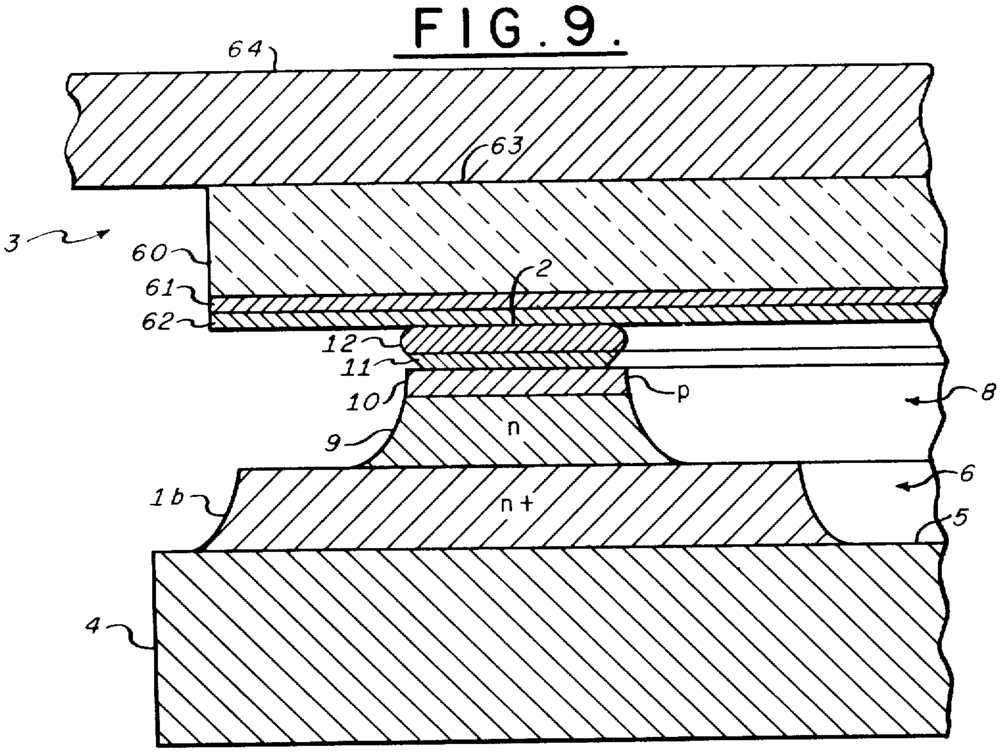
FIG. 9 is a detailed fragmentary view of part of FIG. 1.

According to another aspect of the invention, superior thermal compression bonds are made at junction 2 of the structure shown in FIGS. 1 and 9 with a heat sink, preferably of diamond, though other good heat conducting materials may be used. As in FIG. 9, the diamond layer 60 of the heat sink 3 is first coated by sputtering or evaporation, for example, with a thin film 61 of chromium which is found to adhere very tightly to diamond. The diamond surface may be ground flat and prepared for the chromium deposition by washing it in hot sulfuric or chromic acid, followed by a succession of rinses with pure water and by final drying. The chromium layer 61 may then be applied by evaporation to a depth of about 50 to 100 Angstroms. A gold layer 62 may be formed next also by evaporation, and is made about 3000 Angstroms thick, being firmly bonded to chromium layer 61. It is found desirable, but not absolutely necessary, that the chromium layer 61 have excellent adhesion to the diamond in order subsequently to form a good thermal compression bond; unexpectedly, it has been discovered that the use of the respective chromium and gold layers 61 and 62 on diamond layer 60 with a thermal compression bonding procedure improves the chromium to diamond bond. When the bonding pressure has been applied, it is found that the adhesion of the evaporated chromium film 61 to the diamond layer 60 is thereby increased considerably. This method of coating the diamond and thermal compression bonding has produced mechanically strong bonds where breaking forces are realized as high as 20,000 pounds per square inch for gold-to-gold bonds at surface 2.

In completing the diode structure according to the novel invention, the diamond heat sink 3, as is seen in FIG. 9, will have been affixed at surface 63 to a relatively massive copper or other metal base heat sink element 64. A conventional process will suffice to form the permanent bond at interface 63. Conventional methods successfully employ soldering of a metallized surface of the diamond layer 60 to the metal base 64, but are not satisfactory for forming the bond at surface 2, as previously noted.

The diamond heat sink 3 is placed with its metal base 64 on the platform of a generally conventional precision press and the structure of FIG. 8 is placed on top of the diamond layer 60 after layers 61 and 62 are applied to layer 60. The force that accomplishes the bonding must be applied so as to ensure even pressure over the entire ring surface 2. If even pressure is not applied, a uniform thermal compression bond may not be formed. Accordingly, the bonding pressure face of the pressure applying tool is placed over the geometric center of ring 2. Since the gold layer 4 can pivot to a large degree, correct alignment of the surfaces to be bonded at ring 2 occurs automatically. In order to achieve the correct alignment required for perfect thermal compression bonding, it is advantageous that the backing element is in the form of the permanently integrated gold plate. The 3 to 4 mil thick gold plate 4 readily serves this purpose, being easily strong enough to distribute the bonding forces. Details of the press used in the bonding step need not be supplied here, since commercially available hydraulic or other presses, equipped with standard force gauging or control instruments may be readily adapted for the purpose. When the thermal compression bonding process is carried out according to the novel method, bonding pressures as high as 60,000 pounds per square inch may be applied successfully to silicon devices without damaging them, as opposed to the 20,000 maximum limit commonly imposed when prior art methods are used. Highly reliable and uniform thermal compression bonds with minimum risk to both device and quality of the bond can be accomplished at pressures as low as about 30,000 pounds per square inch. The desired gold layer thermal bonding temperature (275° to 350° C) is supplied by placing the diode device within a conventional heater of the type known in the art as a heat column, so that heat flows into heat sink layer 3 and thus to the junction 2 to be bonded. Automatically controlled heaters may be employed which conventionally control the temperature at junction 2 so that it lies in the range from 300° to 320°C, thus ensuring that high quality bonds are regularly formed. The general thermal compression bonding process for forming the final product shown in FIG. 9 may be similar to that described in further detail in the copending U.S. patent application Ser. No. 222,771 for a "A Dual-Mesa Ring-Shaped High Frequency Diode", filed Feb. 2, 1972 in the names of C. N. Potter and H. Kroger and assigned to the Sperry Rand Corporation.

It should further be observed that the described process has started with an *n*+ substrate in order to produce a *p-n-n*+ device. However, it will be understood that the same process may be used to generate a complementary *n-p-p*+ structure, starting with a *p*+ substrate, and the scope of the invention is intended to cover construction of either of the *p-n-n*+ and *n-p-p*+ devices. It will be apparent to those skilled in the art that the novel method may be used to make both kinds of devices.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. A method of manufacture affording protection of a first portion of a silicon semiconductor diode body while etching a second portion of said semiconductor body, said first portion projecting from said second portion, comprising the steps of:

coating said first and second portions with a continuous temporary chromium layer, coating said continuous temporary chromium layer with a continuous temporary gold layer, coating said continuous temporary gold layer overlying said first portion with a fluid photoresist layer, photographically exposing said fluid photoresist layer and generating a temporary etch-resistant mask, removing by etching said continuous temporary gold and chromium layers overlying said second portion, etching said second portion to a predetermined depth, removing said temporary etch-resistant mask from said first portion, and removing by etching the remainder of said continuous temporary metal gold and chromium layers from said first portion.

2. The method as described in claim 1 wherein said steps of coating said first and second portions with said continuous temporary chromium and gold layers comprise:

rotating said semiconductor body about an axis within a substantial vacuum, coating said first and second portions while rotating said semiconductor body about said axis with said continuous temporary chromium layer generated by a chromium vapor source disposed within said substantial vacuum so that said chromium vapor therefrom is incident upon the surfaces of said portions at an angle oblique to said surfaces so that said temporary chromium layer extends continuously over the contiguous surfaces of both of said portions, and coating said continuous chromium layer over said first and second portions while rotating said semiconductor body about said axis with said continuous temporary gold layer generated by a gold vapor source disposed within said substantial vacuum so that said gold vapor therefrom is incident upon the surfaces of said chromium layer so that said temporary gold layer extends continuously over said continuous chromium layer.

* * * * *